United States Patent
Suzuki et al.

(10) Patent No.: US 6,582,535 B1
(45) Date of Patent: Jun. 24, 2003

(54) TUNGSTEN TARGET FOR SPUTTERING AND METHOD FOR PREPARING THEREOF

(75) Inventors: Satoru Suzuki, Ibaraki (JP); Hirohito Miyashita, Ibaraki (JP)

(73) Assignee: Nikko Materials Company, Limited, Tokyo (JP)

( * ) Notice: Subject to any disclaimer, the term of this patent is extended or adjusted under 35 U.S.C. 154(b) by 0 days.

(21) Appl. No.: 09/980,932

(22) PCT Filed: Jun. 6, 2000

(86) PCT No.: PCT/JP00/03665

§ 371 (c)(1),
(2), (4) Date: Dec. 5, 2001

(87) PCT Pub. No.: WO01/23635

PCT Pub. Date: Apr. 5, 2001

(30) Foreign Application Priority Data

Sep. 28, 1999 (JP) ............................................. 11-273638

(51) Int. Cl.⁷ ............................ C21D 1/00; F27B 14/00; F27B 9/12; H05B 1/00

(52) U.S. Cl. ............................ 148/513; 432/13; 432/18; 219/149; 219/154

(58) Field of Search ..................... 204/298.13; 148/423, 148/513; 420/430; 432/13, 18, 23, 24; 219/149, 154

(56) References Cited

U.S. PATENT DOCUMENTS 6,200,694 B1   3/2001   Kohsaka et al. ............ 428/663

FOREIGN PATENT DOCUMENTS

| JP | 04-160104 | 6/1992 |
| JP | 05-222525 | 8/1993 |
| JP | 06-220625 | 8/1994 |
| JP | 07-076771 | 3/1995 |
| JP | 10-183341 | 7/1998 |
| WO | WO 95/16797 | 6/1995 |

OTHER PUBLICATIONS

English translation of JP 10–183341.*
English translation of JP 07–076771.*
English translation of JP 06–220625.*
English translation of JP 05–222525.*
English translation of JP 4–160104.*
Patent Abstracts of Japan, English Abstract of JP 07–076771.
Patent Abstracts of Japan, English Abstract of JP 10–183341.
Patent Abstracts of Japan, English Abstract of JP 06–220625.
Patent Abstracts of Japan, English Abstract of JP 05–222525.
Patent Abstracts of Japan, English Abstract of JP 04–160104.

* cited by examiner

*Primary Examiner*—Steven H. VerSteeg
(74) *Attorney, Agent, or Firm*—Howson and Howson

(57) ABSTRACT

A tungsten powder having a powder specific surface of 0.4 m²/g or more is hot-pressed at a temperature of 1,600° C. or more and then subjected to HIP at a temperature of 1,700° C. or more without capsuling, whereby a tungsten target for sputtering is manufactured that has a relative density of 99% or more and an average crystal grain size of 100 μm or less. This manufacturing method can manufacture, stably at a low cost, a tungsten target having such a high density and fine crystal structure as cannot be attained by the conventional pressure sintering method, and can greatly decrease the number of particle defects on a film produced by using such a target.

1 Claim, No Drawings

TUNGSTEN TARGET FOR SPUTTERING AND METHOD FOR PREPARING THEREOF

FIELD OF THE INVENTION

The present invention relates to a tungsten target that is used in forming gate electrodes, interconnections, or the like of an IC, an LSI, or the like by sputtering, as well as to a manufacturing method of such a tungsten target.

BACKGROUND OF THE INVENTION

With recent increase in the integration density of VLSIs, studies are now being made to use materials having lower electric resistance values for electrodes and interconnection. In these circumstances, high-purity tungsten that has a small electric resistance value and is stable thermally and chemically is considered promising as a material for electrodes and interconnections.

In general, electrodes and interconnections of VLSIs are formed by the sputtering or CVD. And the sputtering is used more widely than CVD because sputtering systems are relatively simple in configuration and manipulation and the sputtering allows easy formation of a film at a low cost.

However, in forming electrodes or interconnections of a VLSI by sputtering, if defects called particles are formed on a resulting film surface, they may cause a failure such as a wiring defect. This is a factor of lowering the yield. To decrease the probability of occurrence of particles on a film surface formed, a tungsten target having a high density and fine crystal grains is required.

Among the conventional methods for manufacturing a tungsten target are a method disclosed in Japanese Patent Laid-Open No. 61-107728 in which an ingot is produced by an electron beam melting method and then hot-rolled, a method disclosed in Japanese Patent Laid-Open No. 3-150356 in which a tungsten powder is pressure-sintered and then rolled, and what is called a CVD-W method disclosed in Japanese Patent Laid-Open No. 6-158300 in which a tungsten layer is laid on one surface of a tungsten bottom plate by CVD.

However, the above-mentioned two methods have problems that a manufactured tungsten target is fragile because large crystal grains tend to be formed and that particle defects tend to occur on a film formed by sputtering.

On the other hand, although a tungsten target manufactured by the CVD-W method exhibits good sputtering characteristics, it has problems that manufacture of a target takes very long time and is costly. That is, the CVD-W method is less economical.

OBJECTS OF THE INVENTION

The object of the present invention is to provide a powder sintering method having a relatively simple manufacturing process, and to provide an improved method for manufacturing a tungsten target by improving the sintered characteristics of a tungsten powder used. The improved method should manufacture, stably at a low cost, a tungsten target having a high density and fine crystal structure that cannot be attained by conventional pressure sintering methods, and should suppress occurrence of particle defects on a film produced by using such a target.

SUMMARY OF THE INVENTION

It is known in the powder metallurgy that usually the degree of sintering increases as the grain size of a powder used becomes smaller, that is, the specific surface increases. However, even fine ones of high-purity tungsten powders on the market have as small specific surfaces as about $0.2 \, m^2/g$.

The inventors have studied a pressure sintering method using a tungsten powder having a large specific surface, and have succeeded in making the relative density 99% or more, average grain size 100 μm or less and the oxygen content 20 ppm or less, by sintering a tungsten powder having a powder specific surface of $0.4 \, m^2/g$ or more (BET method), preferably, $0.6 \, m^2/g$ or more (BET method). As a result, a tungsten target for sputtering has been realized that can suppress occurrence of particle defects on a sputtered film.

The invention provides a manufacturing method of a tungsten target for sputtering, comprising the steps of hot-press-sintering a tungsten powder having a powder specific surface of $0.4 \, m^2/g$ or more, preferably $0.6 \, m^2/g$, as measured according to a BET method in vacuum or a reducing atmosphere; and subjecting a resulting sintered body to hot isotropic (isostatic) pressure sintering (HIP).

In this manufacturing method, a tungsten target for sputtering that has a high density and a fine crystal structure can be manufactured more effectively by each of the following:

Producing a sintered body having a relative density of 93% or more by the hot press sintering.

Performing the hot press sintering at a temperature of 1,600° C. or more and a pressure of 200 $kg/cm^2$ or more.

Performing the hot isotropic pressure sintering (HIP) without capsuling.

Performing the hot isotropic pressure sintering at a temperature of 1,700° C. or more and a pressure of 1,000 $kg/cm^2$ or more.

The above methods make it possible to manufacture, stably at a low cost, a tungsten target for sputtering that has, after the hot isotropic pressure sintering, a relative density of 99% or more, an average grain size of 100 μm or less, and an oxygen content of 20 ppm or less.

DETAILED DESCRIPTION OF THE PREFERRED EMBODIMENTS

Usually, high-purity tungsten powders on the market having purity of 5N or higher have as small specific surfaces as $0.2 \, m^2/g$ or less. To manufacture a tungsten target having a relative density of 99% or more by pressure sintering by using such a tungsten powder, a sintering temperature of 2,000° C. or more is necessary. However, at such a high sintering temperature, the crystal grain size becomes as large as more than 100 μm.

Pressure sintering at such a high temperature causes serious problems such as reaction between dies and tungsten (hot press) and reaction between a capsule material and tungsten (HIP). This results in cost increase.

It is known in the powder metallurgy that usually the degree of sintering increases as the grain size of a powder used becomes smaller, that is, the specific surface increases.

However, as mentioned above, even fine ones of high-purity tungsten powders on the market have as small specific surfaces as about $0.2 \, m^2/g$.

In view of the above, the inventors produced a tungsten powder whose specific surface is in a range of $0.4–1.4 \, m^2/g$ by using ammonium methatungstate as a starting material and properly controlling the supply amount of a hydrogen gas and increasing the rate of eliminating a reaction product gas in hydrogen-reducing a tungstate crystal having purity of 5N or higher obtained by refining (purifying) the starting material.

The tungsten powder having such a large specific surface was hot pressed at a temperature of 1,600° C. or more and a pressure of 200 kg/cm² or more, whereby the relative density became 93% or more. Since closed pores were formed, HIP was possible without capsuling.

Although setting the hot press temperature at 2,000° C. or more is effective for increasing the density, it causes such problems as increase in crystal grain size and reaction with dies. Therefore, it is preferable that the hot press is performed at 1,900° C. or less.

Then, HIP was performed at a temperature of 1,700° C. or more and a pressure of 1,000 kg/cm² or more, whereby a tungsten target having a relative density of 99% or more and an average crystal grain size of 100 $\mu$m or less was produced.

As the specific surface of a tungsten powder increases, the density of a tungsten sintered body increases and its crystal structure becomes finer, which facilitates density increase in the HIP and increases a post-HIP density.

The number of particle defects on films formed by using a tungsten target that was manufactured in the above manner decreased to a large extent.

EXAMPLES AND COMPARATIVE EXAMPLES

Examples and Comparative Examples will be described below. These Examples are just examples, and the invention is not limited to those and includes other modes and modifications.

Examples

Tungsten powders having specific surfaces of 0.42, 0.62, 1.1, and 1.4 m²/g, respectively, were hot-pressed by using carbon dies at a pressure of 200 kg/cm² and temperatures of 1,600° C. and 1,800° C.

Table 1 shows relative densities of respective tungsten sintered bodies produced and average crystal grain sizes. These tungsten sintered bodies were then subjected to HIP for 2 hours at 1,800° C. and 1,500 kg/cm². Table 1 also shows relative densities, average crystal grain sizes, and oxygen contents of respective sintered bodies produced by the HIP as well as the numbers of particles on films formed by sputtering by using the respective sintered bodies produced by the HIP.

As shown in Table 1, after the hot press, the sintered bodies had relative densities in a range of 93.7% to 98.8%. After the HIP, the tungsten sintered bodies had relative densities in a range of 99.0% to 99.7%, that is, all the tungsten sintered bodies had relative densities that are higher than 99%. There was a tendency that the relative density increased as the specific surface of a tungsten powder increased.

The tungsten sintered bodies had average crystal grain sizes in a range of 55–88 $\mu$m, that is, all the tungsten sintered bodies had average crystal grain sizes that are less than 100 $\mu$m. Further all the tungsten sintered bodies had oxygen contents that are less than 20 ppm.

The numbers of particles on the films formed by sputtering by using the above tungsten sintered bodies were in a range of 0.01–0.07/cm², that is, the numbers of particles on all the films were less than 0.1/cm²; the films had good quality.

Comparative Example 1

Hot press was performed under the same conditions as in the Examples (pressure: 200 kg/cm²; temperature: 1,600° C. and 1,800° C.) except that a tungsten powder having a specific surface of 0.23 m²/g was used. Then, resulting tungsten sintered bodies were subjected HIP for 2 hours at 1,800° C. and 1,500 kg/cm².

Table 1 shows, in the same manner as in the case of the Examples, relative densities and average crystal grain sizes of respective sintered bodies produced by the hot press and relative densities, average crystal grain sizes, and oxygen contents of respective sintered bodies produced by the HIP. Table 1 also shows the numbers of particles on films formed by sputtering by using the respective tungsten sintered bodies produced by the HIP.

As seen from Table 1, when the hot press temperature was 1,600° C., the relative densities after the hot press and after the HIP were as low as 91.1% and 93.2%, respectively. The numbers of particles on the film formed by sputtering by using this sintered body was 1.7/cm²; this is an abnormally large number and hence this sputtering film is unsatisfactory.

When the hot press temperature was 1,800° C., the relative density after the hot press was 93.6%, which is almost satisfactory. However, the relative density of the sintered body after the HIP was as low as 98.7%. Further, the average grain size after the HIP was 130 $\mu$m, which does not clear a level required by the invention.

TABLE 1

|  | Specific surface (m²/g) | Hot press temp. (° C.) | Relative density after hot press (%) | After HIP | | | |
| --- | --- | --- | --- | --- | --- | --- | --- |
|  |  |  |  | Relative density (%) | Average grain size ($\mu$m) | Oxygen content (ppm) | Number of particles (/cm²) |
| Examples | 0.42 | 1600 | 93.7 | 99.0 | 74 | <20 | 0.07 |
|  |  | 1800 | 96.8 | 99.1 | 88 | <20 | 0.07 |
|  | 0.62 | 1600 | 95.2 | 99.2 | 69 | <20 | 0.05 |
|  |  | 1800 | 97.8 | 99.4 | 80 | <20 | 0.06 |
|  | 1.1 | 1600 | 95.9 | 99.5 | 58 | <20 | 0.04 |
|  |  | 1800 | 98.2 | 99.6 | 60 | <20 | 0.01 |
|  | 1.4 | 1600 | 96.3 | 99.6 | 65 | <20 | 0.05 |
|  |  | 1800 | 98.8 | 99.7 | 60 | <20 | 0.03 |
| Comparative examples | 0.23 | 1600 | 91.1 | 93.2 | 94 | <20 | 1.7 |
|  |  | 1800 | 93.6 | 98.7 | 130 | <20 | 0.6 |
|  |  | 2200 | 95.4 | 99.0 | 177 | <20 | 0.3 |

Further, the number of particles of a film obtained by sputtering by using this sintered body was 0.6 /cm$^2$; this is an unacceptably large number and hence this sputtering film is unsatisfactory.

As described above, the number of particles was more than 0.3/cm$^2$ in each film formed by the sputtering. A sputtering film that will function satisfactorily as electrodes or interconnections of a VLSI could not be obtained.

Comparative Example 2

A tungsten powder having a specific surface of 0.23 m$^2$/g was hot-pressed by using carbon dies at a temperature of 2,200° C. and a pressure of 300 kg/cm$^2$ and then subjected to HIP for 2 hours at a temperature of 1,800° C. and a pressure of 1,500 kg/cm$^2$. Table 1 shows evaluation results of a resulting sintered body.

The relative densities after the hot press and after the HIP were 95.5% and 99.0%, respectively, which are satisfactory. However, the crystal grain size was as large as 177$\mu$m. Further, the number of particles was as large as 0.3 /cm$^2$. As in the case of Comparative Examples 1, no sputtering film that will function satisfactorily as electrodes or interconnections of a VLSI could not be obtained.

In addition, strong reaction with the carbon dies occurred during the hot press and hence the life of the dies was short. It is concluded from the above results that the use of the tungsten powder having a specific surface of 0.23 m$^2$/g is problematic. Further, the hot press temperature of 2,200° C. decreases the efficiency of manufacture and hence is not proper.

A tungsten target for sputtering manufactured according to the method of the present invention has features that the relative density is higher and the crystal grain size is smaller than a tungsten target manufactured by the conventional pressure sintering methods. The method according to the invention has an advantage that it can make the manufacturing cost much lower than in the conventional CVD-W method.

Further, the formation of a film by sputtering by using such a tungsten target is very advantageous in that the number of particle defects on a sputtered film remarkably decreases and the production yield increases to a large extent.

What is claimed is:

1. A manufacturing method of a tungsten target for sputtering, consisting of the steps of:

hot-press-sintering a tungsten powder having a powder specific surface of 0.6 m$^2$/g or more as measured according to a BET method in a vacuum or a reducing atmosphere at a temperature of at least 1,600° C. and a pressure of at least 200 kg/cm$^2$ to produce a sintered body having a relative density of at least 93%: and performing hot isotropic pressure sintering (HIP) on said sintered body at a temperature of at least 1,700° C. and a pressure of at least 1,000 kg/cm$^2$ without capsuling:

wherein, after aid hot isotropic pressure sintering step said sintered body has a relative density of at least 99%, an average grain size of no greater than 100$\mu$m, and an oxygen content of no greater than 20 ppm.

* * * * *